United States Patent [19]

Schmitt et al.

[11] 4,203,132

[45] May 13, 1980

[54] METHOD OF ALIGNMENT

[75] Inventors: Alfons Schmitt, Talheim; Klaus Schäfer, Heilbronn; Diether Utz, Öhringen, all of Fed. Rep. of Germany

[73] Assignee: Licentia Patent-Verwaltungs-G.m.b.H., Frankfurt am Main, Fed. Rep. of Germany

[21] Appl. No.: 837,889

[22] Filed: Sep. 29, 1977

[30] Foreign Application Priority Data

Sep. 29, 1976 [DE] Fed. Rep. of Germany ....... 2643810

[51] Int. Cl.² .............................................. H04N 7/00
[52] U.S. Cl. .................................... 358/101; 356/400; 364/559
[58] Field of Search ............... 358/101; 356/186, 187, 356/399, 400; 340/146.3 H; 364/559

[56] References Cited

U.S. PATENT DOCUMENTS

| | | | |
|---|---|---|---|
| 3,693,154 | 9/1972 | Kubo et al. | 358/107 |
| 3,814,845 | 6/1974 | Hurlbrink et al. | 358/101 |
| 3,899,634 | 8/1975 | Montone et al. | 358/101 |
| 4,070,117 | 1/1978 | Johannsmeier et al. | 356/400 |
| 4,115,762 | 9/1978 | Akiyama et al. | 340/146.3 H |

Primary Examiner—Robert L. Griffin
Assistant Examiner—Edward L. Coles
Attorney, Agent, or Firm—Spencer & Kaye

[57] ABSTRACT

A method of alignment of two parts comprises separating the two parts and producing images of the separated parts, breaking down the images into image points with a spacing smaller than the required accuracy, digitalizing the information content of the image points and comparing the actual position of the parts, taking into account the initial separation, and moving the two parts, into alignment from the results of the comparison.

15 Claims, 5 Drawing Figures

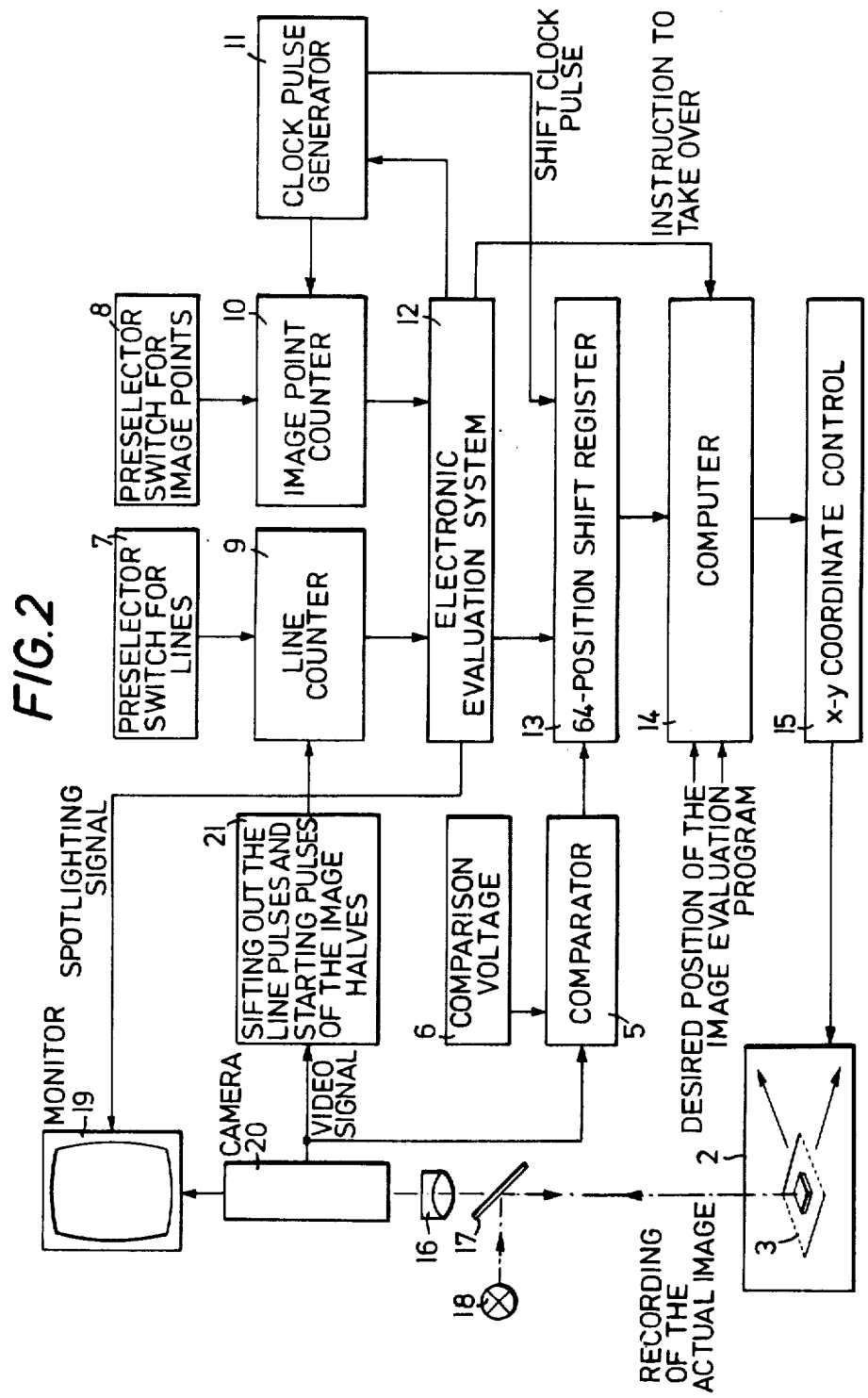

METHOD OF ALIGNMENT

BACKGROUND OF THE INVENTION

The invention relates to a method of aligning two parts, for example the connection contacts of a semiconductor component to the contact fingers of a contacting strip.

In the methods of alignment previously used, the semiconductor body provided with structures or with aids to alignment or a semiconductor chip was aligned by observation under the microscope with the aid of micro-manipulators so that the structures of the semiconductor body or of the semiconductor disc reached coincidence with corresponding structures of the processing means or the contact means. This method of alignment takes place manually and thus is cost-intensive and time-consuming.

SUMMARY OF THE INVENTION

It is an object of the invention to provide a method of alignment in which the connection contacts of a semiconductor component may be aligned fully automatically to the contact fingers of a contacting strip.

According to the invention, there is provided a method of alignment of two parts comprising separating said two parts to a predetermined extent, producing a separate image of the actual positions of the two parts breaking down said images of said actual positions into image points with a spacing smaller than the required accuracy, digitalising the information content of said image points, comparing said actual positions from said information content of said images in a processing system, calculating the deviation of said actual positions from the required alignment positions taking into account the initial separation and moving the two parts into the required alignment position again taking into account the initial separation.

Further according to the invention, there is provided a method of aligning the connection contacts of a semiconductor component with the contact fingers of a contacting strip, characterised in that the contacting strip and the semiconductor component are moved out of alignment by defined distances in the alignment system, these distances being so large that the alignment position of the contacting strip is not coincident with nor does it overlap the alignment position of the semiconductor component; that one image respectively is produced by the actual positions of the two alignment positions thus separated and these images are broken down into image points the spacing of which image points is smaller than the required alignment accuracy; that the information content of the image points is digitalised and stored; that, while taking into account the defined movement out of adjustment which has been undertaken, the position of the two alignment positions is compared in a data processing system and deviations are calculated; and that the parts to be aligned are then displaced with respect to each other by the amount of the calculated deviations from the desired position of coincidence of the two alignment positions while taking into account the defined movement out of alignment with the aid of movement controlled by the data processing system.

BRIEF DESCRIPTION OF THE DRAWINGS

The invention will now be described in greater detail, by way of example, with reference to the drawings, in which:

FIG. 2 is a block diagram for detecting an alignment position according to the method of the invention;

DESCRIPTION OF THE PREFERRED EMBODIMENT

Figure 1:
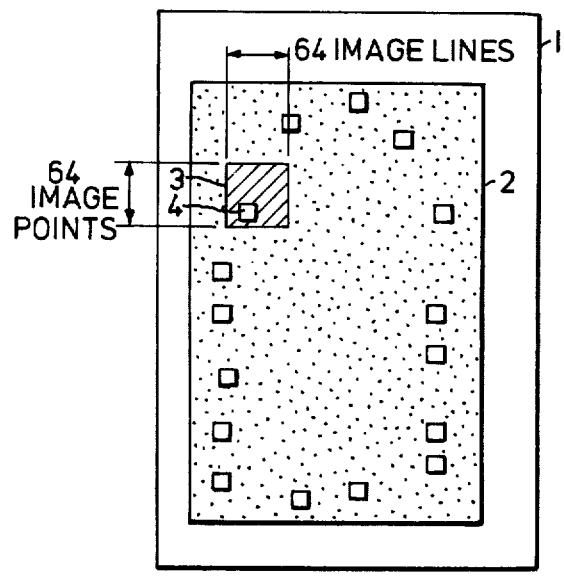
FIG. 1 is a view of an overall image detected by a television camera used in one form of the method of the invention.

In a preferred embodiment of the invention, applied to connection contacts of a semiconductor component and the contact fingers of a contacting strip, the contacting strip and the semiconductor component are moved out of alignment be defined distances in the alignment system, these distances being so large that the alignment position of the contacting strip is not coincident with nor does it overlap the alignment position of the semiconductor component; an image respectively is produced by the actual positions of the two alignment positions thus separated and these images are broken down into image points, the spacing of which is smaller than the required alignment accuracy; the information content of these image points is digitalised and stored; the two alignment positions are compared and deviations are calculated in a data processing system while taking into account the defined movement out of adjustment which had been undertaken; and the parts to be aligned are displaced in relation to each other by the amount of the calculated deviations from the desired position of coincidence of the two alignment positions while taking account of the defined movement out of adjustment with the aid of movement devices controlled by means of the data processing system.

The sought after movement out of adjustment is necessary in order to prevent the contact finger from partially covering the connection contact since otherwise the exact position of the two parts to be aligned could not be clearly determined.

The method in accordance with the invention has the advantage that it takes place fully automatically and visual observation of the process of alignment is no longer absolutely necessary. In a particularly advantageous manner integrated semiconductor circuits may be aligned with the method described with so-called contact spiders, which contain a strip-shaped contact finger for each connection contact. After alignment it is possible to contact all contacts of the circuit simultaneously in one operating process to their assigned contact fingers. Contacting is carried out prefereably in the apparatus serving also for the purpose of alignment.

In preferred manner a television image of the parts to be aligned is produced whereby only those image portions of this television image containing the alignment position need be digitalised and stored. The image portions must be selected so as to be so large that, while taking notice of the accuracy of feed of the parts to be aligned into the alignment system, each alignment position lies safely within the assigned image portion. Thus a structure of the parts to be aligned with each other appear in each image portion. The desired position of coincidence of the two alignment positions is stored in the data processing system as the desired position. The actual positions appearing in the image portions are compared with the desired position with the aid of the new method and the deviations determined during this comparison are calculated by the data processing system and thereafter are converted into an appropriate relative displacement of the parts with respect to each other taking into account the defined movement out of adjustment of the two parts which has been carried out.

The television image may be reproduced with the aid of a monitor for the purpose of visual control which however is not absolutely necessary. The image portions to be digitalised and stored are reproduced within this television image preferably brighter than the rest so that any observer is always able to establish whether the structures of the two parts used as aids to alignment each lie in an image portion. This makes it possible to control the accuracy of feed of the parts to be aligned into the alignment system as well as to check the sought after movement out of alignment.

A television image comprises two image halves whereby the first image half contains only the odd numbers of lines of the television image while the even numbers of lines are reproduced in the second image half. It has been proved that, in order to carry out the method in accordance with the invention, it is sufficient in only the image portions from one of the two image halves of the television image are digitalised. In this way the method of alignment may be speeded up since it is not necessary to wait for scanning of the second image half first. A metallic connection contact and its direct surroundings are contained preferably in the image portion for the semiconductor body, while the second image portion detects the outer free end of a contact finger and its direct surroundings.

An electronic device for detecting the image is assigned to the two image portions, said electronic device being set in operation by the starting pulse of the assigned image half.

In the method in accordance with the invention, provision is made for the line pulses and the starting pulses for the image halves to be filtered out from the pulses emitted by the television camera and the line pulses are passed to a line counter after the starting pulse for the predetermined image half. This line counter only releases storage of a part of the image points of a predetermined number of successive lines from a number of lines predetermined by a preselector switch. This is necessary because only those lines of the television image falling into the image portion are to be interrogated. The image lines thus selected, of which only a part have to be stored, are broken down into image points with the aid of a clock pulse generator. An image point counter is connected after the clock pulse generator, said counter only triggering storage of a predetermined number of successive image points after a number of image points of each line predetermined by a preselector switch. This counting of the image points is necessary since only the image points falling into the image portion are to be digitalised and stored.

In order to be able to store the information content of the image points, a binary quantity must be assigned to the respective brilliance value of each image point. This takes place in that up to a certain brilliance, an image point is declared "black" and is provided with a binary quantity while an image point whose brilliance exceeds the selected threshold value counts as "white" and is provided with the other binary quantity. For this purpose, the image signal during the scanning time of the image portion is passed to a comparator in which the voltage corresponding to the image brilliance is compared with a comparison voltage corresponding to the threshold value such that, when the comparison voltage is fallen below, the information content of the image corresponds to one binary value and when the comparison voltage is exceeded the information content of the image point corresponds to the other binary value "0" or "1". The digitalised information content of the image points of an image line to be stored away, said information content corresponding to a "black-white instruction" is registered in a shift register having an appropriate number of positions. After storing the image points of each line, the information content of the shift register, which comprises a series of "0" and "1" values, is transmitted into a computer. After transmitting the image points of all the image lines to be stored, the stored entire content of the actual image in the computer is compared to the similarly stored entire picture of the desired image. With the aid of a programme to be input into the computer the deviations between the actual images and the desired image are calculated and these are converted into an appropriate displacement of the bodies to be aligned, whereby the sought after movement out of alignment which has been undertaken is cancelled.

Referring now to the drawings, it will be explained initially, by way of FIGS. 1 and 2, how an alignment position, e.g. at the connection contact on the semiconductor body, is detected, stored away and compared with an assigned desired position.

By appropriate illumination of the semiconductor body it is possible for the connection contact to stand out very clearly from its surroundings. If, for example, the surroundings are bright, and the connection contact is dark then it is sufficient, for the purpose of digitalizing the image, to compare the image content of the television signal to a "black-white threshold".

An industrial television camera in commercial use having 875 lines per image is used to produce the television image, said camera detecting the image of the semiconductor component to be aligned by means of an optical system having the desired enlargement. Since the edge length of semiconductor components or integrated circuits is only a few mm, the enlargement of the optical system is set, for example so that 200 image lines cover an image region 1 mm in width. The overall image 1 is shown in FIG. 1 and is detected by the television camera. This overall image for example contains an integrated semiconductor circuit 2 which has numerous connection contacts 4 on the structured surface. It is sufficient if one of these connection points 4 is brought into a predetermined desired position with the aid of a corresponding alignment system. If this alignment takes place with sufficient accuracy all of the remaining connection points are brought by it into the required position. With the auxiliary technical means, usual today, it is possible to bring a semiconductor component or an integrated circuit having a supply accuracy of approximately ±100 um into a desired position. This accuracy is not sufficient to connect the connection contacts of the semiconductor disc to contacting webs for example fully automatically. For this purpose an accuracy of approximately ±10 um is necessary and this may be maintained when using the method of alignment in accordance with the invention.

In order to be able to carry out the breakdown of the image as rapidly as possible only one image half of the television image is elevated for an alignment position. With a television system having 875 lines per image the image half thus contains 437 lines of which 410 lines may be used for the image content of the entire image. If it is assumed that the coordinate controls connected thereafter, by means of which the semiconductor body is displaced, have an accuracy of ±5 um then the definition or resolution of the image lines must also be ±5 um if the alignment accuracy demanded has a value of ±10 um. From this it is apparent that the line spacing of the image lines detected must be approximately 5 um large. With the stated accuracy of feed of the semiconductor body, the image window 3 to be scanned must have a minimum value of 300×300 um as a result of the mechanics of the alignment systems of ±100 um and a value of the contacting spot 4 which is to be detected and is of 100×100 um, so that the alignment structure 4 lies safely within the image window 3 to be scanned. With a line spacing of 5 um the image window 3 contains 60 lines to be scanned in a vertical direction.

The entire image size with 410 lines having a spacing of 5 um and an image ratio of 4:3 amounts to 2.73×2.05 um. The optical system for detecting images must therefore be selected so that an image of this size is reproduced by the television camera. Each image line must be broken down into image points which also have a spacing of 5 um. For the purpose of scanning a line 35.5 us are available and this corresponds to a worked line length of 2.73 mm. This means that each image line is broken down into 546 image points. The spacing of two image points then amounts to 65 ns. 60 image points of the total 546 image points of each line fall into the region of the image window 3 if the image window has a width of 300 um. Since many data processing systems have a word width of 16 bits, then a quantity of 64 lines×64 image points would be selected for the image portion 3 and this corresponds to an alignment range of 320×320 um.

In order to be able to detect any desired connection point 4 of the semiconductor body, the image window 3 to be scanned may be brought to any desired position of the image electronically. The image window is made visible by spotlighting the image on the monitor.

The block circuit diagram of the alignment system in accordance with the invention for detecting an alignment position is shown in FIG. 2. The commercial television camera 20 having 875 lines per image detects the picture of the semiconductor component 2 which is to be aligned by means of its optical system 16. For the reasons already described, the magnification of the optical system 16 is selected so that the spacing between 2 lines is 5 um. The semiconductor component 2 is illuminated via a semitransparent mirror 17 by direct illumination 18 so that am image is formed having the greatest possible contrast. The connection points 4 (FIG. 1) appear dark black with respect to the semiconductor surface surrounding them. The video signal of the television camera is supplied on the one hand to the monitor 19 which shows the picture of the semiconductor body and on the other hand to an electronic system 21 which filters out of the video signal the pulse for the beginning of the second image half and the line pulses.

As soon as the pulse for the beginning of the second image half appears the subsequent line pulses are passed to a line counter 9 which is preset at the line number by means of a preselector switch 7 in which the image scanning is to be begun in a vertical direction. Thus the vertical position of the image portion to be scanned may be set by the preselector switch. With every line pulse which reaches the line counter 9 the counter state is lowered by 1 until the position 0 is reached. Then a further counter counts the 64 lines to be scanned which must be broken down into image points. After these 64 line pulses scanning is terminated in a vertical direction.

At the beginning of the first line which is to be scanned and falls in the image portion, a 15.38 MHz generator 11 is switched on, breaking down this line into image points of 65 ns duration. The pulses of the clock pulse generator 11 are supplied to a counter 10 which is preset to the image point by means of the line pulse by a preselector switch 8, in which scanning is to take place in a horizontal direction. Thus the beginning of the image portion in a horizontal direction is determined by means of the preselector switch. With each incoming image point pulse of a line the counter state of the image point counter 10 is lowered by 1 until the counter state 0 is reached. Then a further counter counts the 64 image points to be scanned which are to be stored away in a shift register 13. At the end of these 64 counter steps one line is scanned. The electronic system 12 for evaluation now establishes whether the 64 image points of a line have just been scanned. During this time the 64-position shift register 13 is released for storing away the image points. The shift clock pulse for the shift register is taken from the clock pulse generator 11. During the time in which the scanning of the image points takes place the brilliance of the monitor is increased by the electronic system of evaluation. As a result a brightly illuminated image portion is obtained on the monitor, said image portion corresponding to the scanned image portion 3 (FIG. 1).

During the time in which the 64 image points are scanned the 64-position shift register as already mentioned is now released for the purpose of accommodating the information content of these image points. In order to be able to meet a black-white decision for each image point the video signal from the television camera is supplied to a comparison circuit 5, to which moreover a comparison voltage 6 is supplied the latter defining the threshold for the black-white decision. The comparator 5 emits a signal if the video signal exceeds the threshold value of the comparison voltage said signal corresponding to the value "black". When the threshold value is not exceeded or is fallen below, the comparator emits a signal which corresponds to the value "white". A binary quantity "0" or "1" is assigned to the values "white" and "black" respectively.

During the scanning time a binary quantity is entered in the shift register every 65 ns, this quantity corresponding to the signal value arising at this point in time respectively at the output of the comparator. After 64 counting pulses, the scanned 64 image points of the appropriate line are stored in the shift register 13. After storing the 64 image points of an image line the computer 14 receives an instruction to take over the shift register content from the electronic evaluation system 12. This is then transmitted into the computer 14 via the fast data channel. In this way all of the 64 desired lines are scanned and stored away in the computer.

If all of the 64 lines have been worked through, this is registered via the electronic evaluation system 12 of the system of computation 14. The computer now compares the scanned image in accordance with a predetermined evaluation programme with the desired position of the alignment field stored away in the computer and calculates the deviation in the semiconductor component 1 from this desired position from the differences. The deviations determined are transmitted by the computer to an X-Y coordinate control 15 which contains drive motors. The semiconductor body may now for example be transported into the desired position with the aid thereof.

Figure 3:
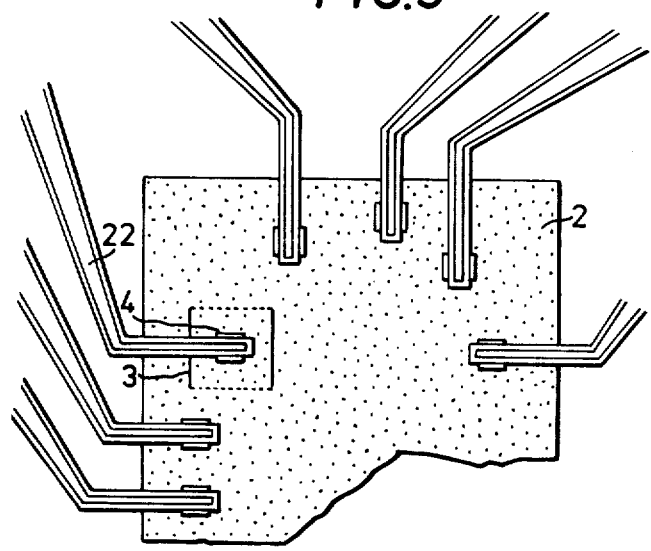
FIG. 3 is a plan view showing how the contact fingers of a contact strip are connected to the contacts of a semiconductor device.

In FIG. 3 it is shown how the metal contacts of the semiconductor element or the integrated circuit are connected to the contact fingers of a so-called contact spider. If the contact spider having the contact fingers 22 and the semiconductor body 2 were not moved out of alignment in the sought after manner then a contact finger 22 would overlap the metal contact 4 in the detected image portion 3 in a manner which could not be exactly detected by the electronic system. Moreover, the largely bright contact finger could not be exactly established in relation to the similarly bright semiconductor body.

Figure 4:
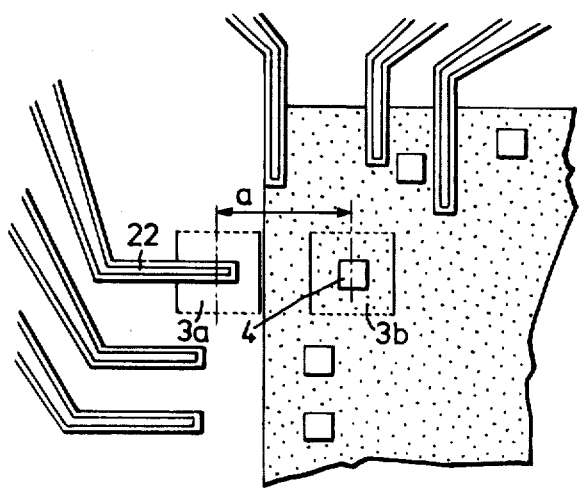
FIG. 4 is a view similar to FIG. 3 but showing the separation of the contacts and contact fingers.

In order to avoid the stated difficulties in accordance with FIG. 4 the contact spider and the semiconductor body are moved out of alignment in the sought after manner by a defined spacing a before alignment. The quantity of the movement out of alignment is selected so that only the outer free end of the contacting finger appears safely in an image portion 3a to be detected while in the other image portion 3b the metal contact 4 appears. The image portions are in turn 320×320 um large. Then with the known accuracy of feed of the part to be aligned into the alignment system it is ensured that the aids to alignment, i.e. the metal contact 4 and the end of the contact finger 22, appear in the assigned image portion.

Figure 5:
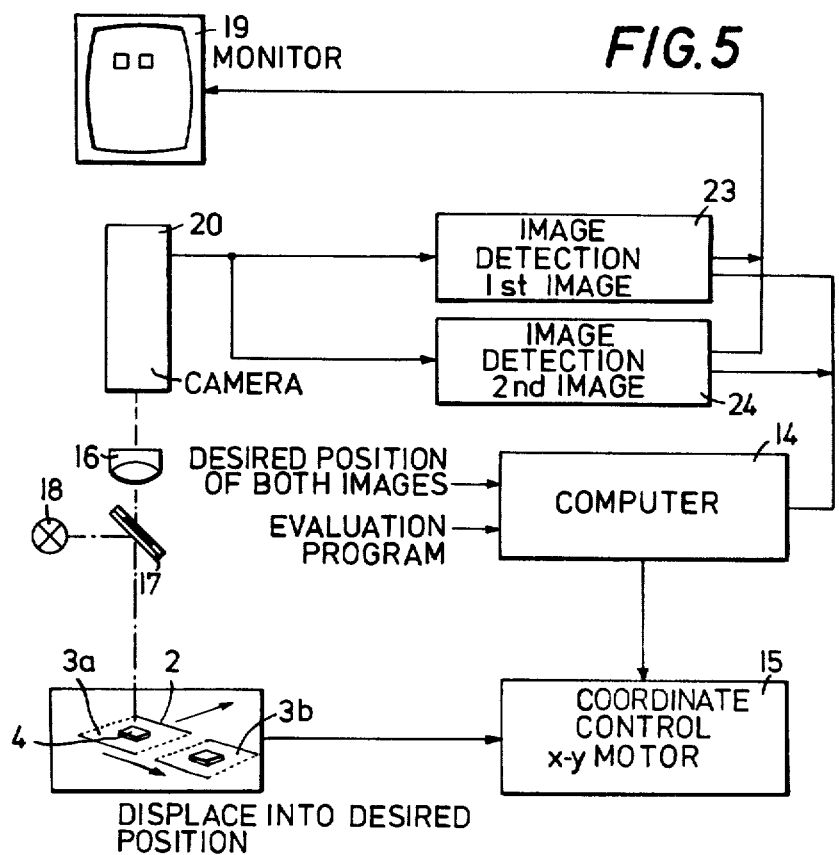
FIG. 5 is a simplified block diagram of an alignment system according to the method of the invention.

The first image half of the television image is used in preferred manner to detect the image of the image portions 3a and 3b. Obviously the appropriate part of the second image half may be seen from the television image for the purpose of detecting the second image portion 3b. The simplified block circuit diagram is shown in FIG. 5. A television camera 20 which accommodates an image of the semiconductor component or the integrated circuit 2 by means of an optical system 16, a mirror 17 and the illumination source 18 and passes it on to a monitor 19 or to the two systems of image detection 23 and 24 (detailed description see FIG. 2) is also necessary. The digitalized image portions are fed in turn into a computer 14 and are compared there with the desired position of coincidence or desired position of the two images stored away with the aid of an appropriate evaluation programme, whereby the movement out of alignment carried out in the sought after manner is taken into account. From the deviations, the required control commands are calculated for the coordinate control in the x-y direction. The displacement of the semiconductor body or of the base carrying the semiconductor body, the contact spider or both parts, takes place by means of appropriately driven control motors. Thus the movement out of alignment is cancelled so that after the alignment process the ends of the contact fingers lie over the metal contacts and may be connected to these for example by means of soldering.

It will be understood that the above description of the present invention is susceptible to various modification changes and adaptations.

What is claimed is:

1. A method of aligning the connection contacts of a semiconductor component with the contact fingers of a contacting strip in an alignment system, comprising: moving the contacting strip and the semiconductor component out of alignment by defined distances which are so large that the alignment position of the contacting strip is not coincident with and does not overlap the alignment position of the semiconductor component; producing an image of the actual locations of the two alignment positions thus separated and breaking the image down into image points the spacing of which image points is smaller than the required alignment accuracy; digitalizing and storing the information content of the image points; while taking into account the defined movement out of adjustment which has been undertaken, comparing the locations of the two alignment positions in a data processing system and calculating their deviations; and displacing the parts to be aligned with respect to each other by the amount of the calculated deviations from the desired position of coincidence of the two alignment positions, while taking into account the defined movement out of alignment, with the aid of movement devices controlled by the data processing system.

2. A method as defined in claim 1, wherein said step of producing an image is carried out by producing a television image of the semiconductor component and the contacting strip and said step of digitalizing and storing is carried out only on those image portions of this television image which contain the alignment positions.

3. A method as defined in claim 2 further comprising reproducing said television image for visual control by means of a monitor.

4. A method as defined in claim 2, wherein said step of producing an image is carried out in a manner to cause said image portions to be sufficiently large that, when taking note of the supply accuracy of feed of the parts to be aligned into the alignment system, the alignment positions lie safely within said image portions.

5. A method as defined in claim 2, wherein each said image portion is gathered from one image half of the television image.

6. A method as defined in claim 2, wherein said image portions are gathered from a respective image half of the television image.

7. A method as defined in claim 1, wherein the image of the actual locations serving for position alignment includes a first image portion containing the image of a connection contact on the semiconductor component and its immediate surroundings, and a second image portion containing the image of the outer free end of a contact finger and its immediate surroundings.

8. A method as defined in claim 7, wherein each said image portion encompasses a surface of approximately 300 um×300 um; and said step of producing an image is carried out by means of a television system and an optical system so that approximately 60 lines of a television image half are allotted to each said image portion.

9. A method as defined in claim 8, wherein each image line of the image half is broken down into approximately 550 image points and approximately 60 image points per line are allotted to each said image portion.

10. A method as defined in claim 5, wherein each said image portion is reproduced by a respectively different image half of the television image, and said step of breaking down the image is carried out for each image portion by an electronic system set in operation respectively by the starting pulse of an assigned image half.

11. A method as defined in claim 1, wherein said step of producing an image is performed by a raster scanning television camera and comprises filtering out line pulses and starting pulses for the image halves from the pulses emitted by the television camera producing the images and passing the line pulses which occur after the starting pulse for a predetermined image half to a line counter which only triggers storage of a part of the image points of a predetermined number of successive lines from a number of lines predetermined by a preselector switch onwards.

12. A method as defined in claim 11 further comprising breaking down, said image lines, a part of which lines are to be stored away, into image points with the aid of a clock pulse generator; and connecting an image point counter after the clock pulse generator, said image point counter only triggering storage of a predetermined number of successive image points from a number of image points of each line predetermined by a preselector switch onwards.

13. A method as defined in claim 11, wherein said step of digitalizing and storing comprises storing successive image points by passing the image signal from the camera, during the scanning time of an image portion, to a comparator in which the voltage corresponding to the image brilliance is compared to a comparison voltage such that when the comparison voltage is fallen below, the information content of the image is reproduced by one binary value, and when the comparison voltage is exceeded, the information content of the image point is reproduced by the other binary value.

14. A method as defined in claim 13, wherein said step of digitalizing and storing further comprises entering the comparator output, corresponding to a "black-white" instruction, into a shift register having the appropriate number of positions; after storing image points of each said line, transmitting the shift register content into a computer; said step of comparing comprises, after transmitting said image points of all said image lines to be stored in the computer, comparing the total content of said images stored and calculating the deviations; and said step of displacing comprises converting these deviations into a corresponding and relative displacement of the parts to be aligned.

15. A method of alignment of two parts comprising separating said two parts to a predetermined extent producing a separate image of the actual positions of the two parts breaking down said images of said actual positions into image points with a spacing smaller than the required accuracy, digitalising the information content of said image points, comparing said actual positions from said information content of said images in a processing system, calculating the deviations of said actual positions from the required alignment positions taking into account the initial separation and moving the two parts into the required alignment position again taking into account the initial separation.

* * * * *